United States Patent
Yen et al.

(10) Patent No.: US 7,615,773 B2
(45) Date of Patent: Nov. 10, 2009

(54) SEMICONDUCTOR LIGHT-EMITTING DEVICE AND MANUFACTURING METHOD THEREOF

(75) Inventors: Shih-Nan Yen, Hsinchu (TW); Jung-Tu Chiu, Hsinchu (TW); Yu-Jiun Shen, Hsinchu (TW); Ching-Fu Tsai, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 105 days.

(21) Appl. No.: 11/647,170

(22) Filed: Dec. 29, 2006

(65) Prior Publication Data

US 2007/0152207 A1    Jul. 5, 2007

(30) Foreign Application Priority Data

Dec. 29, 2005    (TW)    .............................. 94147367 A (51) Int. Cl.
    *H01L 29/06*    (2006.01)
(52) U.S. Cl. ................. 257/14; 257/101; 257/E33.008; 438/37
(58) Field of Classification Search .................... 257/14, 257/101, E33.008
    See application file for complete search history.

(56) References Cited

U.S. PATENT DOCUMENTS

| 6,552,367 | B1 | 4/2003 | Hsieh et al. |
| 6,876,005 | B2 | 4/2005 | Hsieh et al. |
| 7,312,468 | B2 | 12/2007 | Watanabe et al. |
| 2002/0190261 | A1 * | 12/2002 | Sarathy et al. ................ 257/98 |

FOREIGN PATENT DOCUMENTS

| CN | 1330415 A | 1/2002 |
| CN | 1549356 A | 11/2004 |
| CN | 1714487 A | 12/2005 |
| JP | 2001-168471 | 6/2001 |

* cited by examiner

*Primary Examiner*—Tu-Tu V Ho
(74) *Attorney, Agent, or Firm*—Bacon & Thomas, PLLC (57) ABSTRACT

A semiconductor light-emitting device comprises a substrate; and an active layer formed over the substrate comprising a well layer having an unintentionally-doped impurities; a first barrier layer; and a second barrier layer, wherein the well layer is disposed between the first barrier layer and the second barrier layer, the first barrier layer comprises an n-type-impurities-intentionally-doped portion near to the well layer, and an n-type-impurities-unintentionally-doped portion distant from the well layer; the second barrier layer comprises an n-type-impurities-unintentionally-doped portion near to the well layer.

17 Claims, 6 Drawing Sheets

SEMICONDUCTOR LIGHT-EMITTING DEVICE AND MANUFACTURING METHOD THEREOF

BACKGROUND OF THE INVENTION

1. Technical Field

The present invention relates to a light-emitting device and the manufacturing method thereof, and in particular to a semiconductor light-emitting device and the manufacturing method thereof.

2. Reference to Related Application

This application claims the right of priority based on TW application Ser. No. 94147367, filed Dec. 29, 2005, entitled "Semiconductor Light-emitting Device and Manufacturing Method thereof", and the contents of which are incorporated herein by reference.

3. Description of the Related Art

Light-emitting diode (LED) devices are widely used in different fields such as displays, traffic lights, data storage apparatus, communication apparatus, lighting apparatus, and medical apparatus. One important task for engineers is to increase the brightness of the LED devices.

In a conventional nitride semiconductor light-emitting device, a structure of the active layer is normally a multiple quantum well (MQW) structure doped with n-type impurities. The quantum well structure includes a well layer sandwiched between each pair of adjacent barrier layers, and there are generally three methods to dope the n-type impurities. The first method is to dope n-type impurities in barrier layers uniformly, and unintentionally dope impurities in well layers. The second method is to dope n-type impurities in well layers uniformly, and unintentionally dope impurities in barrier layers. The third method is to dope n-type impurities in both well layers and barrier layers uniformly. However, the brightness of a light-emitting device manufactured by any of these doping methods is still not satisfactory.

A conventional laser diode includes a quantum well structure comprising a well layer sandwiched between a first barrier layer and a second barrier layer is disclosed to resolve the above problem. The method for manufacturing the laser diode comprises doping impurities at a portion of the first barrier layer at the interface with the well layer while the remaining portion of the first barrier layer is un-doped; doping impurities into a portion of the well layer at the interface with the first barrier layer while the remaining portion of the well layer is un-doped; and doping impurities into a portion of the second barrier layer distant from the interface with the well layer while the remaining portion of the second barrier layer is kept un-doped. Thereby, The brightness of the laser diode is improved.

SUMMARY OF THE INVENTION

Accordingly, the present invention is to provide a semiconductor light-emitting device and the manufacturing method thereof. The semiconductor light-emitting device has the advantages of high brightness and low forward voltage for improving the electric character of the light-emitting device. As embodied and broadly described herein, the present invention provides a semiconductor light-emitting device comprising a substrate, an active layer formed over the substrate including a well layer having unintentionally doped impurities, a first barrier layer, and a second barrier layer. The well layer is disposed between the first barrier layer and the second barrier layer, wherein the first barrier layer comprises a portion, having intentionally doped n-type impurities, near the well layer, and a portion, having unintentionally doped n-type impurities, distant from the well layer; and the second barrier layer comprises a portion, having unintentionally doped n-type impurities, near the well layer.

The present invention provides a method for manufacturing the semiconductor light-emitting device comprising the steps of: forming a well layer having unintentionally doped impurities, the well layer comprising a first surface and a second surface opposite to the first surface; forming a first barrier layer, wherein the step of forming a first barrier layer includes forming a portion, having intentionally doped n-type impurities, near the first surface and a portion, having unintentionally doped n-type impurities, distant from the first surface; and forming a second barrier layer, wherein the step of forming a second barrier layer includes forming a portion, having unintentionally doped n-type impurities, near the second surface.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Reference will now be made in detail to the preferred embodiments of the present invention, examples of which are illustrated in the accompanying drawings. Wherever possible, the same reference numbers are used in the drawings and the description to refer to the same or like parts.

Figure 1:
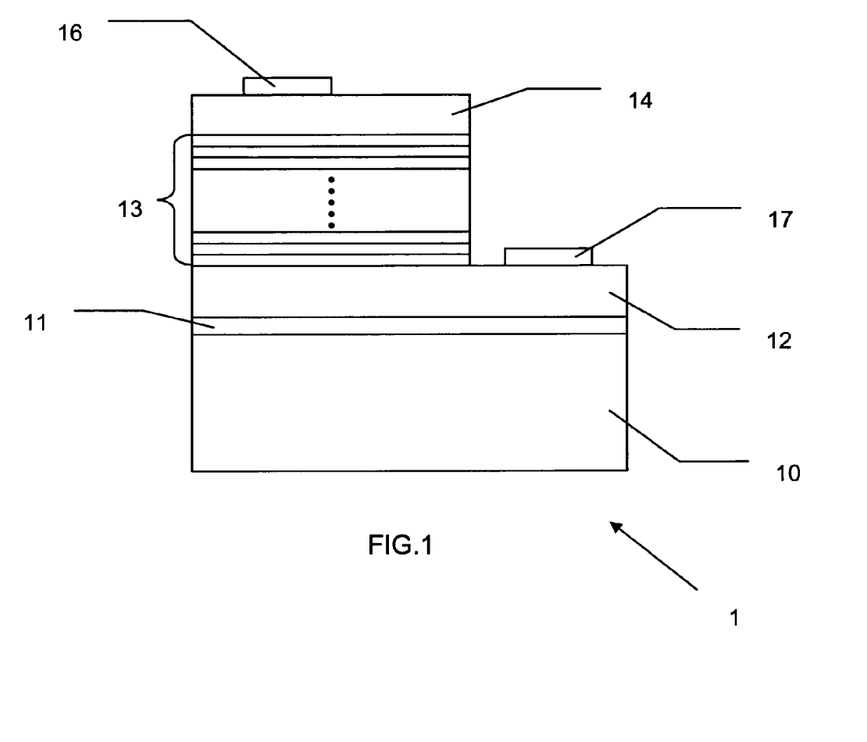
FIG. 1 is a schematic cross-sectional view of a semiconductor light-emitting device in accordance with a first embodiment of the present invention.
Figure 2A:
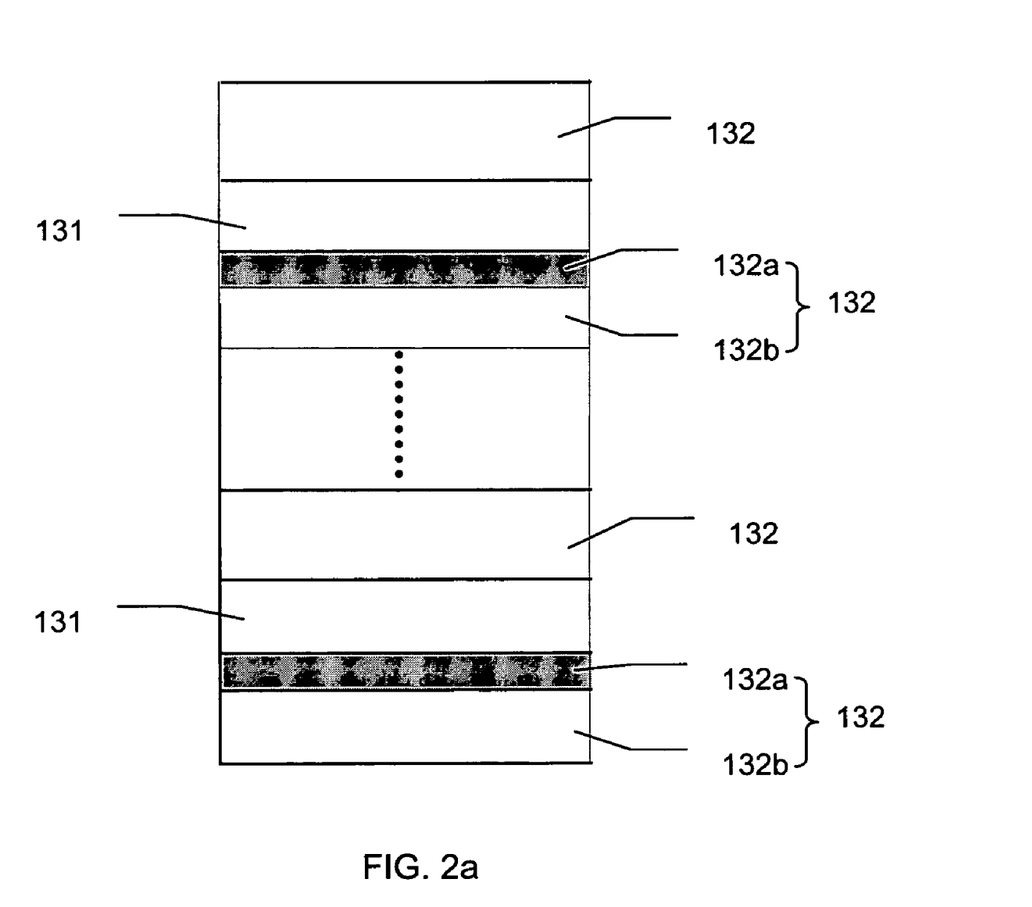
FIG. 2a is a schematic cross-sectional view of an active layer structure in accordance with a first embodiment of the present invention.
Figure 2B:
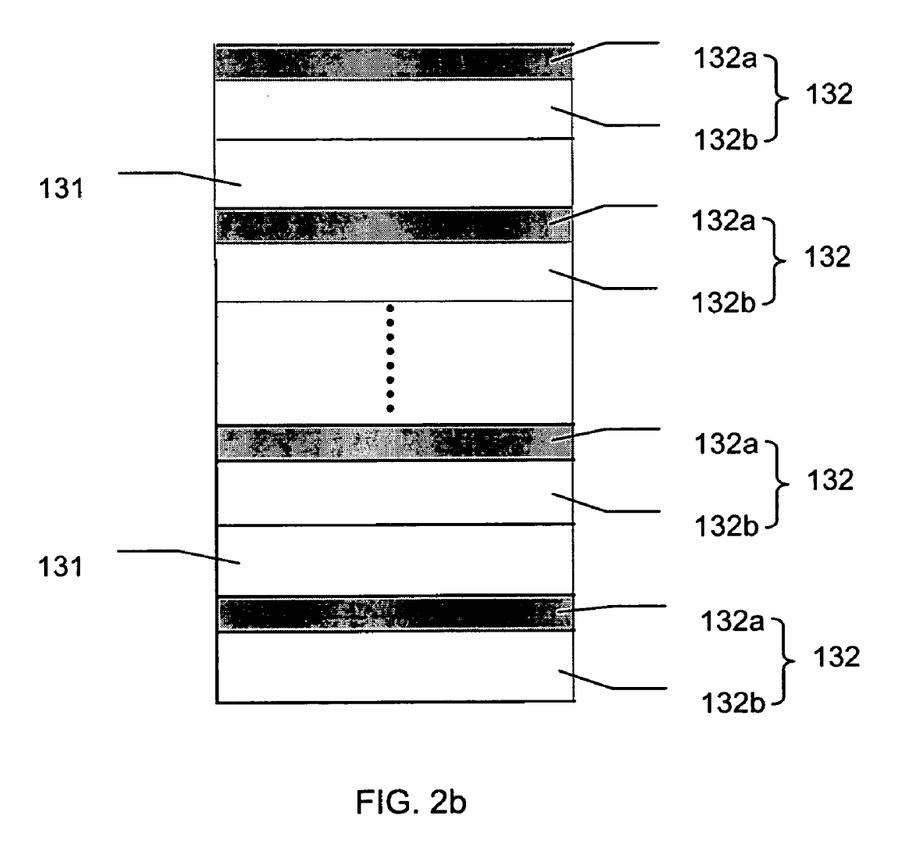
FIG. 2b is a schematic cross-sectional view of another active layer structure in accordance with a first embodiment of the present invention.

Referring to FIGS. 1, 2a and 2b, these schematic cross-sectional views show a semiconductor light-emitting device 1 and its active layer in accordance with a first embodiment of the present invention respectively. The semiconductor light-emitting device 1 comprises a substrate 10, a buffer layer 11 formed on the substrate 10, an n-type semiconductor layer 12 having a first upper surface and a second upper surface formed on the buffer layer 11, an active layer 13 formed on the first upper surface, a p-type semiconductor layer 14 formed on the active layer 13, a first electrode 16 formed on the p-type semiconductor layer 14, and a second electrode 17 formed on the second upper surface. The active layer 13 is a multiple quantum well structure comprising one or a plurality of well layers 131, and one or a plurality of first barrier layers 132 inserted between the well layers 131. The well layer 131 is an intrinsic semiconductor having unintentionally doped impurities, and the concentration of the impurities is equal or smaller than $1\times10^{17}$ cm$^{-3}$. The well layers 131 comprise an upper surface and a lower surface. The barrier layer 132 is in contact with the lower surface of the well layer 131 and comprises two portions 132a and 132b. The portion 132a, near the lower surface of the well 131, has intentionally doped n-type impurities, and the portion 132b, far from the lower surface of the well 131, has unintentionally doped impurities. Referring to FIG. 2a, the barrier layer 132 in contact with the upper surface of the well layer 131 is a layer having unintentionally doped impurities. Moreover, in order to improve the brightness of the semiconductor light-emitting device 1, the barrier layer 132 in contact with the upper surface of the well 131 also comprises two portions 132a and 132b, as shown in FIG. 2b. The portion 132b, near the upper surface of the well 131, has unintentionally doped impurities, and the portion 132a, far from the upper surface of the well layer 131, has intentionally doped n-type impurities.

The manufacturing method of the semiconductor light-emitting device 1 comprises the following steps: providing a substrate 10; forming a buffer layer 11 on the substrate 10; forming an n-type semiconductor layer 12 on the buffer layer 11; forming an active layer 13 on the n-type semiconductor layer 12, wherein the active layer 13 is a multiple quantum well structure comprising one or a plurality of well layers 131 and one or a plurality of barrier layers 132 inserted between the well layers 131; forming a p-type semiconductor layer 14 on the active layer 13; partially etching the p-type semiconductor layer 14 and the active layer 13 to expose a part of the surface of the n-type semiconductor layer 12; forming a first electrode 16 on the p-type semiconductor layer; and forming a second electrode 17 on the part of the surface of the n-type semiconductor layer 12. The manufacturing method of the active layer 13 comprises the steps of forming a barrier layer having a portion 132b, unintentionally doped with impurities, on the n-type semiconductor layer 12; forming a barrier layer including a portion 132a, intentionally doped with n-type impurities, on the portion 132b; forming a well layer 131, unintentionally doped with impurities, on the portion 132a; forming a barrier layer including a portion 132b, unintentionally doped with impurities, on the well layer 131; forming a barrier layer including a portion 132a, intentionally doped with n-type impurities, on the portion 132b.

Figure 3:
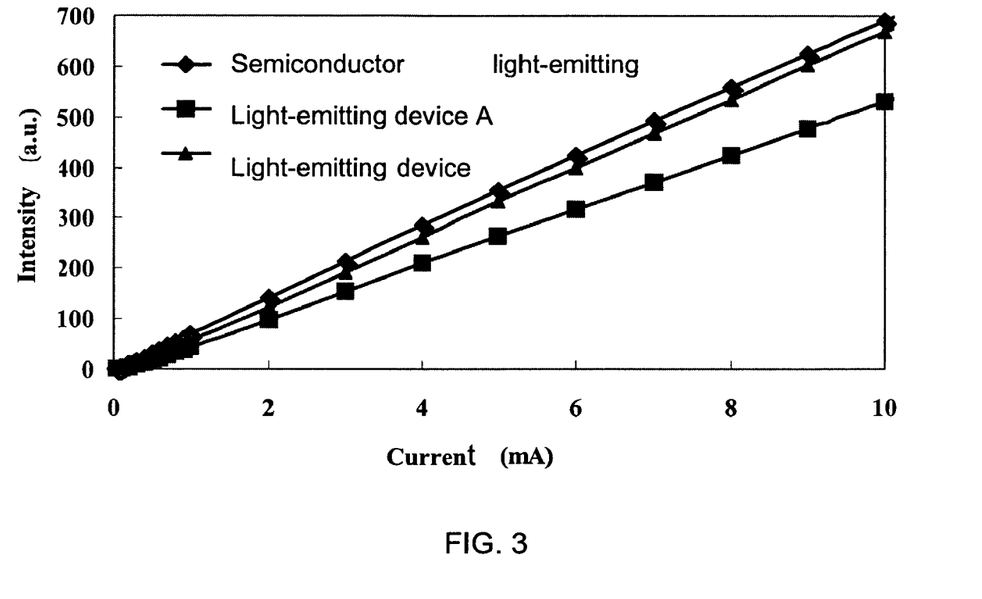
FIG. 3 is a diagram showing a relationship between light intensity and current.
Figure 4:
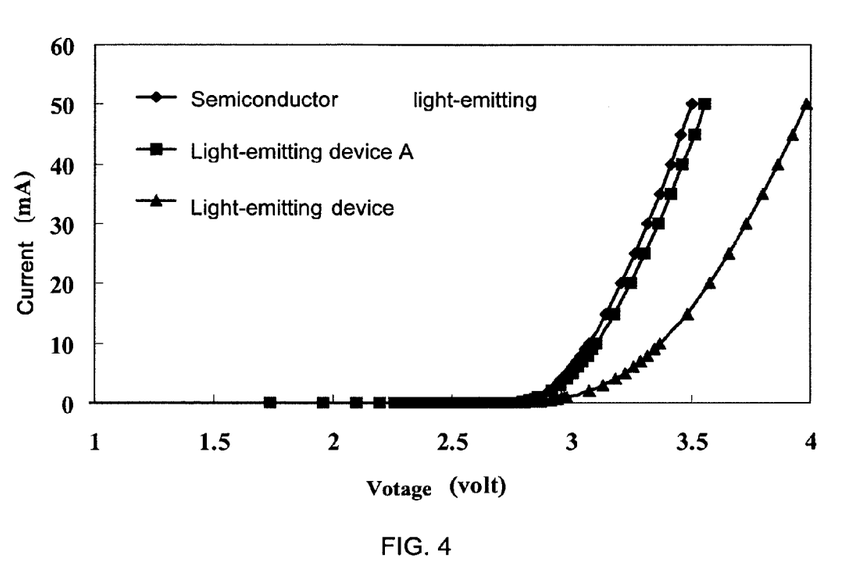
FIG. 4 is a diagram showing a relationship between current and voltage.

FIG. 3 is a diagram showing a comparison among the semiconductor light-emitting device 1 and two types of conventional light-emitting devices A, and B with respect to the relationship between light intensity and current (L-I curve). The well layers of the light-emitting devices are unintentionally doped with impurities, and all the barrier layers are intentionally doped with n-type impurities. The interfaces of well layers and barrier layers of the light-emitting device B are partially intentionally doped with n-type impurities. As shown in FIG. 3, at the same current injection, the light-emitting intensity of the semiconductor light-emitting device 1 is higher than that of the light-emitting devices A and B. Referring to FIG. 4, under the same current injection condition, the operating voltage of the semiconductor light-emitting device 1 is lower than that of the light-emitting devices A and B. The semiconductor light-emitting device 1 has a better electrical characteristic than the light-emitting devices A and B.

The foregoing layers are formed on the substrate 10 by the metal organic chemical vapor deposition method (MOCVD).

Figure 5:
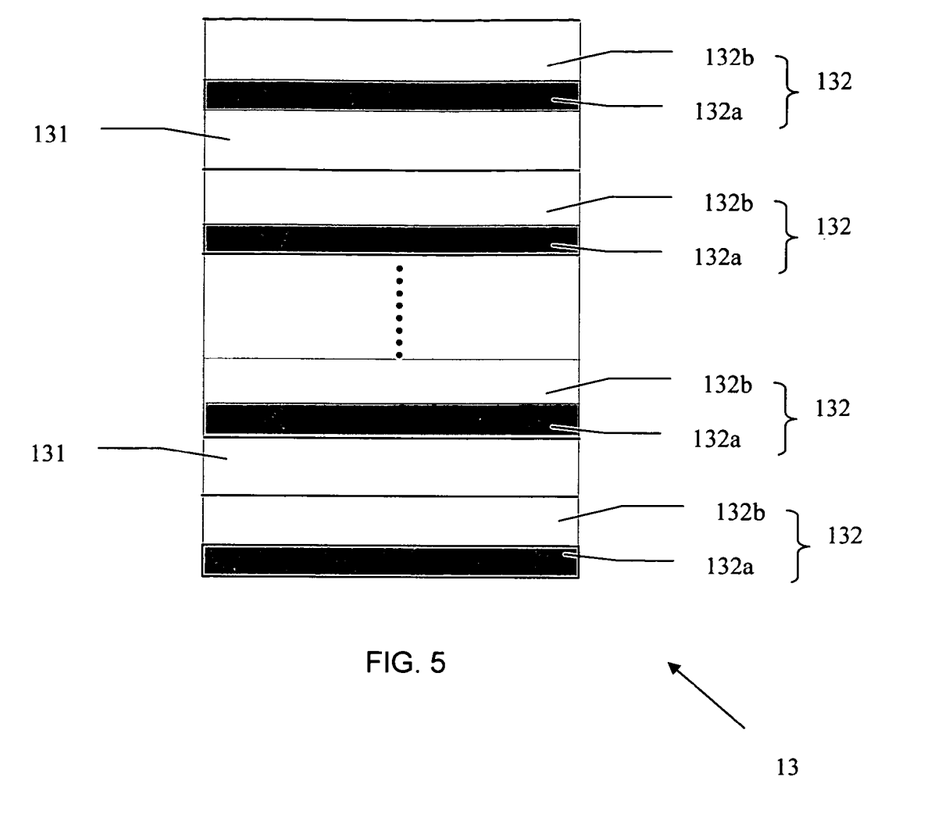
FIG. 5 is a schematic cross-sectional view of an active layer structure in accordance with a second embodiment of the present invention.

Referring to FIG. 5, the multiple quantum well structure 13 of a semiconductor light-emitting device in accordance with the invention is formed by the molecular beam epitaxy method (MBE). In a multiple quantum well structure of a conventional active layer 13, the barrier layer 132 in contact with the lower surface of the well layer 131 is impurity unintentionally doping portion. In contrast, the barrier layer 132, in contact with the lower surface of the well layer 131, of a semiconductor light-emitting device in accordance with the invention comprises two portions 132a and 132b. The portion 132b, near the lower surface of the well layer 131, is unintentionally doped with impurities, and the portion 132a, far from the lower surface of the well layer 131, is intentionally doped with n-type impurities. The barrier layer 132 in contact with the upper surface of the well layer 131 comprises two portions 132a and 132b as well. The portion 132a, near the upper surface of the well layer 131, is intentionally doped with n-type impurities, and the portion 132b, far from the upper surface of the well layer 131, is unintentionally doped with impurities.

The material of the substrate 10 is sapphire. The material of the n-type semiconductor layer 12 is $Al_gIn_hGa_{(1-g-h)}N$ ($0 \leq g \leq 1$, $0 \leq h \leq 1$, $0 \leq g+h \leq 1$). The material of the impurity unintentionally doping portion 132b is $Al_cIn_dGa_{(1c-d)}N$ ($0 \leq c \leq 1$, $0 \leq d \leq 1$, $0 \leq c+d \leq 1$). The concentration of unintentionally doping impurities is equal or smaller than $1\times10^{17}$ cm$^{-3}$. The material composition of each portion 132b can be the same or different. The material of the portion 132a is $Al_xIn_yGa_{(1-x-y)}N$ ($0 \leq x \leq 1$, $0 \leq Y \leq 1$, $0 \leq x y \leq 1$). The material of the n-type impurities comprises at least one material selected from the group consisting of Si, Ge, Sn, Te, 0, S, and C. The concentration of n-type impurities is between $1\times10^{17}$ cm$^{-3}$ and $1\times10^{20}$ cm$^{-3}$, and preferably between $5\times10^{17}$ cm$^{-3}$ and $5\times10^{19}$ cm$^{-3}$. The material composition of each portion 132a can be the same or different. The material of the well layer 131 is $Al_aIn_bGa_{(1-a-b)}N$ ($0 \leq a \leq 1$, $0 \leq b \leq 1$, $0 \leq a+b \leq 1$). The material composition of each well layer 131 can be the same or different. The material of the p-type semiconductor layer 12 is $Al_eIn_fGa_{(1-e-f)}N$ ($0 \leq e \leq 1$, $0 \leq f \leq 1$, $0 \leq e+f \leq 1$).

The ratio of the thickness $B_1$ of the portion 132a and the total thickness B of the barrier layer 132 and the ratio of the thickness $B_2$ of the portion 132b and the total thickness B of the barrier layer 132 affect the brightness of the light-emitting device. The brightness can be enhanced when the ratio of $B_1/B$ is between 0 and 1 and the ratio of $B_2/B$ is between 0 and 1. At this embodiment, the brightness is enhanced at the ratio of $B_1/B$ no greater than ¾, and that of $B_2/B$ greater than ¼. The ratio $B_1/B$ of each barrier layer can be the same or different, and so does the ratio $B_2/B$.

A first transparent conductive layer can be formed between the p-type semiconductor layer 14 and the first electrode 16. A second transparent conductive layer can be formed between the n-type semiconductor layer 12 and the second electrode 17. The material of the first transparent conductive layer and the second transparent conductive layer comprises at least one material selected from the group consisting of indium tin oxide (ITO), cadmium tin oxide (CTO), antimony tin oxide, zinc indium oxide, aluminum zinc oxide, and zinc antimony oxide. For example, the thickness of the ITO is between 50 nm and 1 µm, and the transparency at the wavelength of 300 nm~700 nm is greater than 50%. The method of forming the transparent conductive layer comprises at least one method selected from the group consisting of e-beam evaporation, ion-sputtering, and thermal evaporation. The material of the substrate 10 comprises at least one material selected from the group consisting of ZnO, MgO, and glass. In another embodiment of the present invention, the substrate 10 can be replaced by a conductive substrate, and the second electrode is formed on the lower surface of the conductive substrate. The etching process can be omitted for this embodiment. The material of the conductive substrate comprises at least one material selected from the group consisting of SiC, GaN, AlN, and Si.

The material of the n-type semiconductor layer 12 comprises at least one material selected from the group consisting of AlGaAs, AlGaInP, AlInP, and InGaP. The material of the barrier layer 132 comprises at least one material selected from the group consisting of AlGaAs, AlGaInP, AlInP, and InGaP. The material of the well layer 131 comprises at least one material selected from the group consisting of AlGaAs, AlGaInP, AlInP, and InGaP. The material of the p-type semiconductor layer 14 comprises at least one material selected from the group consisting of AlGaAs, AlGaInP, AlInP, and InGaP. The material of the conductive substrate comprises at least one material selected from the group consisting of GaAs, and GaP.

It will be apparent to those skilled in the art that various modifications and variations can be made to the structure of the present invention without departing from the scope or spirit of the invention. In view of this, it is intended that the present invention covers modifications and variations of this invention provided they fall within the scope of the following claims and their equivalents.

What is claimed is:

1. A semiconductor light-emitting device comprising:
    a substrate; and
    an active layer over the substrate, comprising:
        a well layer consisting essentially of a first surface, a second surface opposite the first surface, and a single region with an unintentionally doping impurity with a concentration of impurities equal to or less than $1 \times 10^{17}$ cm$^{-3}$;
        a first barrier layer comprising an n-type-impurities-intentionally-doped portion near the well layer, and an n-type-impurities-unintentionally-doped portion distant from the well layer; and
        a second barrier layer comprising an n-type-impurities-unintentionally-doped portion near the well layer; and
        wherein the first surface of the well layer is in direct contact with the first barrier layer and the second surface of the well layer is in direct contact with the second barrier layer.

2. The semiconductor light-emitting device according to claim 1, wherein the second barrier layer further comprises an n-type-impurities-intentionally-doped portion distant from the well layer.

3. The semiconductor light-emitting device according to claim 1, further comprising a third barrier layer disposed at the side of the first barrier layer, and the distance between the third barrier layer and the well layer is greater than the distance between the first barrier layer and the well layer; wherein the third barrier layer comprises an n-type-impurities-intentionally-doped portion near the first barrier layer, and an n-type-impurities-unintentionally-doped portion distant from the first barrier layer.

4. The semiconductor light-emitting device according to claim 1, further comprising a fourth barrier layer disposed at the side of the second barrier layer, and the distance between the fourth barrier layer and the well layer is greater than the distance between the second barrier layer and the well layer; wherein the fourth barrier layer comprises an n-type-impurities-unintentionally-doped portion near the first barrier layer, and an n-type-impurities-intentionally-doped portion distant from the first barrier layer.

5. The semiconductor light-emitting device according to claim 1, wherein the thickness of the n-type-impurities-intentionally-doped portion of the first barrier layer is $B_1$, the thickness of the first barrier is B, and the ratio of $B_1/B$ is not greater than $3/4$.

6. The semiconductor light-emitting device according to claim 1, wherein the thickness of the n-type-impurities-unintentionally-doped portion of the second barrier layer is $B_2$, the thickness of the second barrier is B, and the ratio of $B_2/B$ is greater than $1/4$.

7. The semiconductor light-emitting device according to claim 1, wherein the thickness of the n-type-impurities-unintentionally-doped portion of the second barrier layer is $B_2$, the thickness of the second barrier is B, and the ratio of $B_1/B$ is not greater than $3/4$.

8. The semiconductor light-emitting device according to claim 1, wherein the doping concentration of the n-type impurity is between $1 \times 10^{17}$ cm$^{-3}$ and $1 \times 10^{20}$ cm$^{-3}$.

9. The semiconductor light-emitting device according to claim 1, wherein the n-type impurity comprises at least one material selected from the group consisting of Si, Ge, Sn, Te, O, S and C.

10. A method for manufacturing a semiconductor light-emitting device, comprising the steps of:
    forming a well layer consisting essentially of a first surface, a second surface opposite the first surface, and a single region with an unintentionally doping impurity having a concentration of impurities equal to or less than $1 \times 10^{17}$ cm$^{-3}$;
    forming a first barrier layer, comprising the steps of forming an n-type-impurities-intentionally-doped portion near the first surface, and an n-type-impurities-unintentionally-doped portion distant from the first surface; and
    forming a second barrier layer, comprising the steps of forming an n-type-impurities-intentionally-doped portion near the first and
    wherein the first surface of the well layer is in direct contact with the first barrier layer and the second surface of the well layer is in direct contact with the second barrier layer.

11. The method for manufacturing a semiconductor light-emitting device according to claim 10, further comprising forming an n-type-impurities-intentionally-doped portion distant from the second surface.

12. The method for manufacturing a semiconductor light-emitting device according to claim 10, wherein the method is a metal organic chemical vapor deposition.

13. The method for manufacturing a semiconductor light-emitting device according to claim 10, wherein the method is a molecular beam epitaxy method.

14. A semiconductor light-emitting device comprising:
    a substrate; and
    an active layer over the substrate, comprising:
        a well layer consisting essentially of a single region with an unintentional doping impurity;
        a first barrier layer; and
        a second barrier layer; and
        wherein the well layer is formed between the first barrier layer and the second barrier layer, the first barrier layer comprises an n-type-impurities-intentionally-doped portion near the well layer and an n-type-impurities-unintentionally-doped portion distant from the well layer; the second barrier layer comprises an n-type-impurities-unintentionally-doped portion near the well layer and an n-type-impurities-intentionally-doped portion distant from the well layer, and
        wherein the thickness of the n-type-impurities-intentionally-doped portion of the first barrier layer is $B_1$, the thickness of the first barrier is B, and the ratio of $R_1/B$ is not greater than ¾ and the thickness of the n-type-impurities-unintentionally-doped portion of the second barrier layer is $B_2$, the thickness of the second barrier is B', and the ratio of $B_2$/B' is greater than ¼.

15. The semiconductor light-emitting device according to claim 14, further comprising a third barrier layer disposed at the side of the first barrier layer, and the distance between the third barrier layer and the well layer is greater than the distance between the first barrier layer and the well layer; wherein the third barrier layer comprises an n-type-impurities-intentionally-doped portion near the first barrier layer, and an n-type-impurities-unintentionally-doped portion distant from the first barrier layer.

16. The semiconductor light-emitting device according to claim 14, further comprising a fourth barrier layer disposed at the side of the second barrier layer, and the distance between the fourth barrier layer and the well layer is greater than the distance between the second barrier layer and the well layer; wherein the fourth barrier layer comprises an n-type-impurities-unintentionally-doped portion near the first barrier layer, and an n-type-impurities-intentionally-doped portion distant from the first barrier layer.

17. The semiconductor light-emitting device according to claim 14, wherein the well layer comprises at least one material selected from the group consisting of AlGaAs, AlGaInP, AlInP, and InGaP.

* * * * *